(12) United States Patent
Campagna et al.

(10) Patent No.: US 6,992,485 B2
(45) Date of Patent: Jan. 31, 2006

(54) METHOD FOR DETERMINING AN ACCELERATION FACTOR OF A PARALLEL IMAGE ACQUISITION IN MAGNETIC RESONANCE IMAGING

(75) Inventors: Swen Campagna, Engelthal (DE); Stefan Schor, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/925,800

(22) Filed: Aug. 25, 2004

(65) Prior Publication Data

US 2005/0083051 A1 Apr. 21, 2005

(30) Foreign Application Priority Data

Aug. 25, 2003 (DE) ................................ 103 39 019

(51) Int. Cl.
*G01V 3/00* (2006.01)
(52) U.S. Cl. ...................................... 324/309; 324/307
(58) Field of Classification Search ................ 324/309, 324/307, 306, 314, 318, 300
See application file for complete search history.

(56) References Cited

U.S. PATENT DOCUMENTS

| 6,556,009 B2 * | 4/2003 | Kellman et al. ............ 324/309 |
| 6,717,406 B2 * | 4/2004 | Sodickson .................. 324/307 |
| 6,841,998 B1 * | 1/2005 | Griswold .................... 324/309 |
| 6,876,199 B2 * | 4/2005 | Hardy et al. ................ 324/309 |
| 6,879,158 B2 * | 4/2005 | Zhu ........................... 324/318 |

* cited by examiner

*Primary Examiner*—Louis Arana
(74) *Attorney, Agent, or Firm*—Schiff Hardin LLP

(57) ABSTRACT

In a method for determining an acceleration factor of a parallel image acquisition for a data acquisition direction of a measurement volume by means of a magnetic resonance device having multiple coil units, each coil unit emits at least one output signal for parallel image acquisition and wherein an acceleration contribution is assigned for at least one direction (X,Y,Z) for a sensitive volume. Relevant coil units, which by virtue of the arrangement of their sensitive volume in relation to the measurement volume contribute to the acceleration, are specified. The data acquisition direction in the measurement volume is specified and the acceleration factor in this direction is determined by means of acceleration contributions depending on the position of the relevant coil units with respect to one another and the position of the relevant coil units in relation to the measurement volume and to the data acquisition direction.

27 Claims, 2 Drawing Sheets

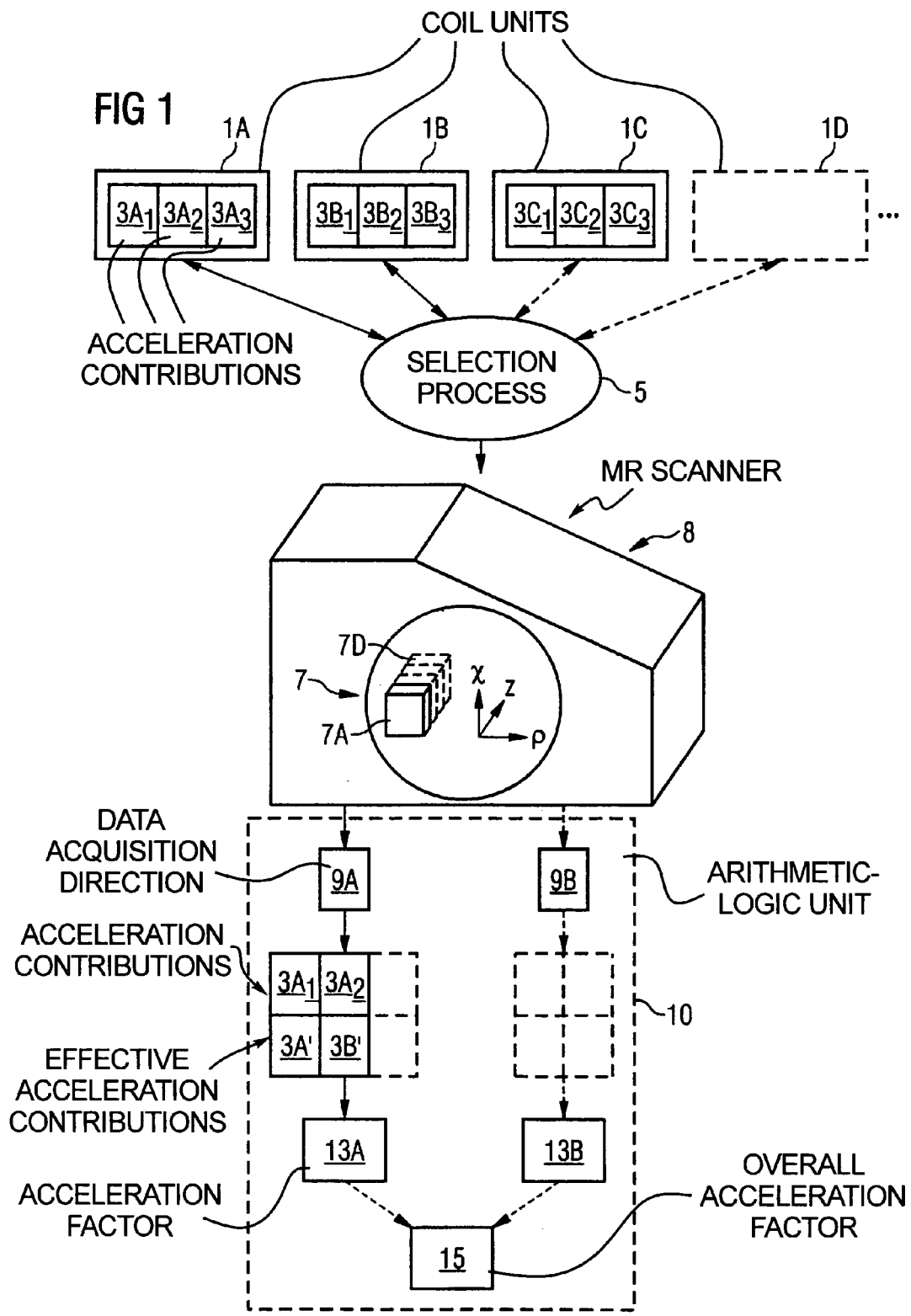

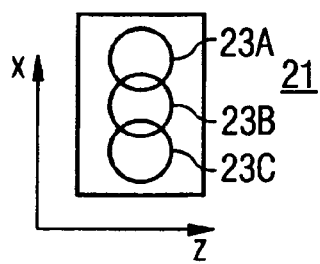
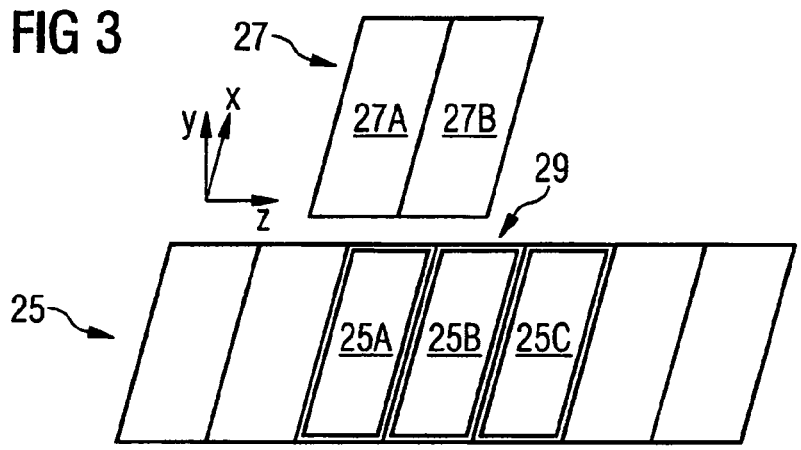
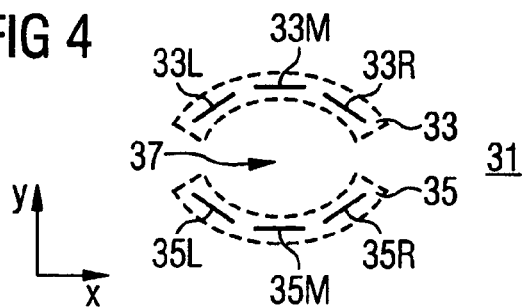
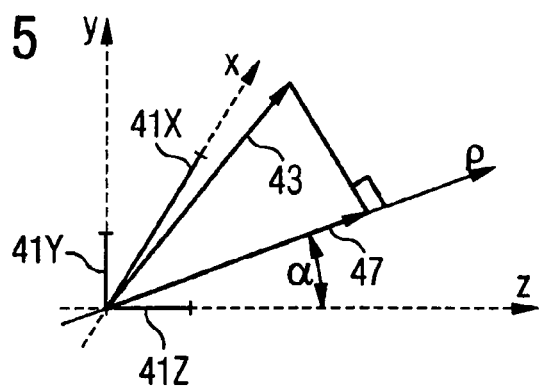

METHOD FOR DETERMINING AN ACCELERATION FACTOR OF A PARALLEL IMAGE ACQUISITION IN MAGNETIC RESONANCE IMAGING

BACKGROUND OF THE INVENTION

1. Field of the Invention

The present invention relates to a method for determining an acceleration factor for a parallel image acquisition using multiple coil units, for a data acquisition direction of a measurement volume, in magnetic resonance tomography.

2. Description of the Prior Art

Parallel acquisition techniques (PAT) can achieve an acceleration of the pure measurement time associated with pulse sequences in magnetic resonance examinations (MR examinations). Here, use is made of the fact that certain location information can in each case be assigned to measured signals from respective MR antennas based on differing sensitivity profiles. A prerequisite for PAT is thus a number of MR antennas, hereinafter called coil units, respectively with spatially different sensitivity profiles. The output signals of the coil units can be signals from individual coils or combinations of these signals, referred to as modes. What is important is that the large number of sensitivity profiles differs in the direction of the acceleration desired.

Acceleration by means of PAT is possible both within a slice plane of an MR examination in phase encoding direction and in the direction of the slice sequence. The dependencies of measurement record parameters, in particular of an acceleration factor, in connection with PAT can in principle be considered independently of one another for each of the possible directions of measurement. An overall acceleration factor is then produced e.g. from the product of the acceleration factors of the different directions.

Depending on the coil units used, the acceleration factor of a magnetic resonance measurement by means of PAT is a freely selectable, generally user-adjustable, parameter. The specification of an appropriate value for this acceleration factor is extremely complex, requires a great amount of experience and precise knowledge of the currently applicable measurement situation. This situation is determined by the coil units used in each case, their spatial arrangement relative to one another and their possible contributions to the acceleration. For each MR measurement a fresh individual decision has to be reached regarding the acceleration factor, in order to achieve good measurement results in a short measurement time. This procedure, based on a manual input and an individual assessment, for selecting the acceleration factor is time-consuming and poorly reproducible and places high demands on the operator carrying out the MR measurement.

SUMMARY OF THE INVENTION

An object of the present invention is to provide a method for determining an acceleration factor for a parallel image acquisition without the aforementioned drawbacks.

This object is achieved according to the invention in a method for determining an acceleration factor of a parallel image acquisition for a direction of data acquisition of a measurement volume in a magnetic resonance device having multiple coil units, wherein each coil unit emits at least one output signal for parallel image acquisition and wherein an acceleration contribution for at least one direction is assigned for a sensitive volume to each coil unit. Relevant coil units, which, by virtue of the arrangement of their sensitive volume in relation to the measurement area, contribute to the acceleration, are specified, and the direction of data acquisition in the measurement volume is specified. The acceleration factor in the direction of data acquisition is determined by means of the acceleration contributions depending on the position of the relevant coil units with respect to one another and the position of the relevant coil units in relation to the measurement volume and the direction of data acquisition.

The method according to the invention determines, preferably automatically, in a quick and readily reproducible manner, the optimum and appropriate acceleration factor, taking into account the necessary constraints imposed for achieving a good image quality and a fast measurement time. Use of the automatically determined acceleration factor thus enables accelerated image acquisition to the maximum appropriate degree coupled with good image quality.

An advantage of the inventive method for the operator of an MR device lies in the fact that progress of the measurement is accelerated substantially and be fully automated with ease. With partially or fully automated determination of the acceleration factor, the process of deciding which factor should be used to carry out the measurement no longer applies for the operator.

A further advantage of the method according to the invention is the fact that it is not obvious for the operator to recognize, in modern MR coil units, the underlying structure of the coils and possible interconnection of their signals into so-called modes. The method according to the invention makes it possible to determine with the aid of the acceleration contributions, possibly adapted to the use of modes, the acceleration factor that is optimally adapted to the different circumstances in each case.

In an embodiment, an effective acceleration contribution in the data acquisition direction is determined for one of the relevant coil units based on their acceleration contribution and their position in relation to this direction. This effective acceleration contribution replaces the assigned acceleration contribution when determining the acceleration factor. This has the advantage that the coil units can be assigned their acceleration contributions irrespective of the data acquisition direction on the basis of their geometry and their structure. Adaptation to the data acquisition direction and the measurement volume is not carried out until later. This has the further advantage that the method can be applied very flexibly with coil units whose position in the MR device, i.e. alignment and position, is freely adjustable.

In another advantageous embodiment, output signals from coils of a coil unit and/or a linear combination of the output signals of coil units or coils are used for the parallel image acquisition. This has the advantage that for example in a PAT coil unit formed of multiple coils arranged geometrically in relation to one another and which can emit a differing number of signals or modes, only the acceleration contribution relating to the particular number of signals or modes is used that is also used in relation to the PAT.

In a further embodiment, the sensitive volume of one of the coil units is determined using a sensitivity profile of the coil unit, or using sensitivity profiles of the coils of the coil unit, or using sensitivity profiles of linear combinations of output signals of the coils of the coil unit. This has the advantage that the sensitive volume assigned to a coil unit is determined using the sensitivity volume dependent by the structure and mode of operation of the coil unit.

In another embodiment, one of the acceleration contributions is defined such that it specifies the possible acceleration of a parallel image acquisition where solely the associated coil unit is used. Here the direction of measurement should essentially match the direction on which the acceleration contribution is based. Such a definition of an acceleration contribution is particularly advantageous if the coil unit constitutes an elemental coil unit, an elemental coil unit being a type of smallest drivable coil unit. The use of different numbers of signals/modes can also be taken into account, i.e. acceleration contributions specifically for different numbers of signals/modes used can be assigned.

When the acceleration contribution is assigned, the use of a further coil unit can also be added as a parameter. For example, a head coil usually is composed of multiple coil units that preferably are operated together and consequently may possibly complement one another advantageously where used jointly for acceleration. Such considerations have a favorable effect on the accuracy of determination of the acceleration factor.

In the case of coil units designed for three-dimensional measurement it is advantageous to assign three acceleration contributions for three directions that reflect the acceleration properties of the coil unit in the directions. The orientation of the coil unit in relation to the measurement volume and its slices, for example, can be processed more easily by this means.

In a further embodiment, an acceleration contribution of a coil unit can be given the form of a vectorial acceleration contribution. The magnitude of the vector preferably corresponds to the acceleration contribution and the direction of the vector to the direction in which the acceleration contribution has been assigned. Additionally, several such vectorial acceleration contributions can be combined, e.g. by means of a vector sum, into a (single) acceleration contribution (vector) of the coil unit. This simplifies the description and enables simpler calculations e.g. when determining relevant acceleration contributions or when determining the acceleration factor.

In a further embodiment, to determine an effective acceleration contribution of one of the coil units, a projection is made of the acceleration contribution of these coil units on to the direction of measurement. If, for example, three acceleration contributions are assigned to a coil unit respectively for three spatial directions, then the projection onto the direction of measurement can be translated to the acceleration contributions and a single effective acceleration contribution of the coil unit determined. This is, for example, the maximum of the 'projected' acceleration contributions.

Alternatively, a projection can be made of the vectorial acceleration contribution, preferably by means of the acceleration contribution vector, which can readily be calculated mathematically.

In a further embodiment, for one of the coil units to which acceleration contributions have been assigned for different directions, the particular acceleration contribution whose direction is closest to the data acquisition direction is determined as the effective acceleration contribution. This procedure is particularly easy to implement. The criterion of when which direction is particularly close can be designed conditionally such that, for example, a preferred direction with the greatest acceleration contribution is determined as the effective acceleration contribution even where there is a deviation of greater than 45°.

In an embodiment, the determined acceleration factor or an overall acceleration factor which has been determined from several acceleration factors determined for different directions of measurement is displayed by the magnetic resonance device. This has the advantage that the operator of the magnetic resonance device is informed about the progress of the process and the acceleration factor determined, and where applicable, also has the option of modifying the value. Furthermore, the acceleration factor or the overall acceleration factor is automatically set as the acceleration factor of parallel image acquisition, so that the parallel image acquisition can automatically be carried out fast and without any user input, at optimum acceleration and good image quality.

DESCRIPTION OF THE DRAWINGS

FIG. 1 is a flowchart of an exemplary embodiment of the method.

FIG. 2 shows an example of a PAT coil unit.

FIG. 3 schematically illustrates PAT coil units of a spine and a body coil unit in a magnetic resonance examination.

FIG. 4 schematically illustrates PAT coil units of a head coil unit.

FIG. 5 is a graph illustrating the determination of an effective acceleration contribution in accordance with the invention.

DESCRIPTION OF THE PREFERRED EMBODIMENTS

The method according to the invention relates to parallel image acquisition by means of an MR device, wherein coil units receive MR signals for the accelerated implementation of MR examinations and emit output signals. The invention relates to coil units with output signals which are read out by the MR device and can be used for parallel image acquisition. Such a coil unit can consist of a single coil. It can also be formed of more complex coil systems, for example of a CP coil for receiving circular polarization (circularly polarized CP) which is composed of two specially formed and arranged coils. In such complex coil systems, multiple coil signals are combined into one signal.

The coil units referred to thus far have a sensitive volume that is determined by the geometry of the coils. Such a coil unit can be used in combination with a further coil unit for parallel image acquisition, whereby the sensitive volumes should at least partially overlap.

Furthermore, there are also coil elements specifically designed for parallel image acquisition, in which e.g. three coils are arranged next to one another, partially overlapping. Such PAT coil units as they are called enable parallel image acquisition with some, e.g. two or three, of their output signals, since their spatial arrangement in relation to one another provides the spatial information needed for PAT. Over and above this, the signals of the coils can, as mentioned, be combined into modes which also contain the spatial information. PAT coil units have a sensitive volume which can for example also be determined by the geometry of the coils on which the combination is based. They can be used alone or together with further coil units for parallel image acquisition. The invention also relates to PAT coil units of this type.

The designated examples of coil units have the common feature that the output signals can be assigned directly to the coil or mode sensitivity profiles underlying them. Consequently they represent a type of elemental coil unit.

In contrast, a head coil, for example, is formed of multiple coil units, such as four symmetrically arranged PAT coil units (two pairs lying parallel, each with two opposing PAT coil units) or a spine coil array of a series of several PAT coil units. In the case of the head coil and spine coil array, the PAT coil units can normally be controlled and selected individually. Coil arrangements like the head coil or spine coil array consequently do not constitute an elemental coil unit in the previous sense. The method also can be applied to coil arrangements of this type.

The assignment of an acceleration contribution preferably is carried out for elemental coil units, since in their case no further dependency has to be taken into account such as the freedom to select the PAT coil units to be used.

For PAT coil units that can be operated with differing numbers of modes used, the assignment of the acceleration contribution preferably is carried out according to the number of modes used.

One factor of the invention is the assignment of information to a coil unit as to the contribution it can provide toward acceleration by means of PAT. To this end, the acceleration contribution for a sensitive volume is assigned to the coil with in respect to at least one direction. The direction preferably is produced from the geometrical structure of the coil unit. A planar coil arrangement in a PAT coil unit suggests as a possible direction, the direction in which the antennas are arranged next to another. Further options are the direction orthogonal in the plane and the direction perpendicular to the plane.

The previously described elemental coil units have essentially only one (used) sensitive volume, so that an acceleration contribution has to be assigned to them just for this area. When the acceleration contribution is assigned, it can also be e.g. a continuous location-dependent function in the sensitive volume.

Coil arrangements of the spine coil array type, by contrast, have a large sensitive volume that is composed of the sensitive volumes of the underlying elemental coil units. Accordingly, the assignment of acceleration contributions is more time-consuming so as to take into account here also the location dependency.

FIG. 1 outlines an embodiment of the method. It shows diagrammatically a number of coil units $1A, \ldots 1C$, to which acceleration contributions $3A_1, \ldots 3C_3$ have been assigned. The information about the acceleration contributions $3A_1, \ldots 3C_3$ can e.g. together with other parameters such as the underlying direction, the geometrical layout, the sensitive volume or the position thereof in relation to the measurement area be stored in a coil-unit-specific file.

The method specifies the relevant coil units which, by virtue of the arrangement of their sensitive volume relative to the measurement area, contribute to the acceleration. Normally, an MR device has a large number of coil units $1A, \ldots 1D$ available for receiving signals. An operator selects from these a sub-group, from which those relevant to acceleration of the image acquisition are then determined. Preferably, those coil units will be selected whose sensitive volume correlates with the measurement area, that is, e.g., arranged at least partially in the measurement area. The selection can on the one hand be carried out manually by the operator. It can alternatively be carried out automatically if the positions of the coil units, the sensitive volumes assigned to them and the position of the measurement volume are known and can consequently be used e.g. to calculate a degree of overlap of the respective sensitive volume with the measurement area. Relevant coil units can be taken into account fully or in part. In the latter case, e.g. a continuous degree of relevance is assigned to them. In FIG. 1, a selection of the (relevant) coil units $1A$ and $1B$ is taking place in the selection process 5.

The operator generally specifies when planning the magnetic resonance acquisition at least one layer, as it is called, as a measurement volume 7, a slice 7A being defined by the read-out direction $\chi$ and a phase-encoding direction $\rho$. If several layers $7A, \ldots 7D$ lie parallel to one another, then this defines a direction Z of the slice sequence. Both the phase-encoding direction $\rho$ and the direction of the layer sequence Z are suitable as the direction of data acquisition $9A, 9B$, i.e. as the direction in which acceleration occurs through the parallel image acquisition. It can be preset either by the operator or automatically by the MR scanner 8.

If the direction to which an acceleration contribution has been assigned deviates from the data acquisition direction $9A, 9B$, it is possibly advantageous if an effective acceleration contribution $3A', 3B'$ is assigned to the corresponding relevant coil unit for the direction of data acquisition $9A, 9B$. This is done, for example, in a control and arithmetic-logic unit 10 of the MR device 8. The acceleration contribution $3A_1, \ldots 3C_3$ and the position of the coil unit relative to the direction of measurement $9A, 9B$ are needed in order to do this. With the latter information, the direction in respect of which the acceleration contribution $3A_1, \ldots 3C_3$ has been assigned can be set in relation to the direction of data acquisition $9A, 9B$ and the effective acceleration contribution $3A', 3B'$ determined.

Finally, e.g. again in the control and arithmetic-logic unit 10, the acceleration factor 13A in the direction of data acquisition 9A is determined by means of the acceleration contributions $3A_1, \ldots 3C_3$ or of the effective acceleration contributions $3A', 3B'$. To do this, the position of the relevant coil units $1A, 1B$ in relation to one another and the position of the relevant coil units $1A, 1B$ in relation to the measurement volume are taken into account. This information is needed, for example, to exclude those coil units that bring about no further acceleration. This arises, e.g., when two PAT coil units are arranged next to one another in such a way that the acceleration effect of the one PAT coil unit is not enhanced by the other PAT coil unit, as described in detail further below. If an acceleration is also possible in a second direction of data acquisition 9B, a second acceleration factor 13B is produced which can be combined with the acceleration factor 13A into an overall acceleration factor 15.

The aforementioned coil units are placed as described below in relation to the method. In the case of parallel acquisition techniques, output signals (hereinafter referred to in abbreviated form as signals) of coil units with differing sensitive volumes are used for imaging. Coil units with one coil (or a complex coil system) and with one signal do not contribute any further location information in addition to their own position. Consequently they receive an acceleration contribution of 1.

The case of a PAT coil unit 21 is shown diagrammatically in FIG. 2. It consists of three coils $23A, \ldots 23C$. Each of the coils $23A, \ldots 23C$ delivers a signal which can be used for parallel image computation. Alternatively, the signals of the three coils $23A \ldots 23C$ can be combined into one, two or three modes. The modes correspond for example to coil signals specifically oriented toward parallel imaging with spatially differing sensitivity profiles.

In the Z direction their acceleration contribution is 1. If all three antenna signals or three modes are used, the PAT coil unit 21 has an acceleration contribution of 3 in the X direction, since the sensitivity profiles of the various coils $23A, \ldots 23C$ deliver additional location information in the X direction for acceleration. In the direction perpendicular to the coil plane the acceleration contribution of the PAT coil unit 21 is also 1.

FIG. 3 illustrates the method in the case of a magnetic-resonance examination with the aid of PAT coil units, as described e.g. in FIG. 2. Several of these PAT coil units are combined on the one hand into a spine coil unit 25 and on the other into a body coil unit 27. The body coil unit 27 consists of two PAT coil units 27A, 27B, the spine coil unit of several PAT coil units 25A, ... 25C. The spine coil unit 25 is integrated, for example, in a patient bed of a magnetic resonance device. The PAT coil units of the spine coil unit 25 and of the body coil unit 27 are arranged essentially parallel to one another. A patient to be examined (not shown in the drawing) would be located in the measurement volume 29 between the spine coil unit 25 and the (superimposed) body coil unit 27.

In accordance with the system of coordinates indicated in FIG. 3, the acceleration contributions of the various PAT coil units are in the X direction 3 and in the Y and Z directions 1 in each case. The PAT coil units 25A, ... 27B are selected for examination. For the sake of simplicity, the three possible directions of measurement coincide with the X, Y and Z directions, so that no determination of effective acceleration contributions is required. Where the directions deviate from one another, the effective acceleration contributions would have to be projected for example in the direction of measurement.

The maximum acceleration contribution in the X direction of the coil units used is 3. Because of the geometrical arrangement, all the coil units accelerate in the same way. This is taken into account and according to the inventive method, the acceleration factor in the X direction is automatically set to 3.

The maximum acceleration factor in the Y direction is produced from the acceleration contributions of the coil units used of the spine coil array 25 and of the body coil 27. The acceleration contributions in the Y direction each amount, as stated, to 1. Since the spine coil array 25 and the body coil 27 are in the Y direction offset relative to one another, both contribute to the PAT. The acceleration contributions can be added. Consequently, according to the invention, a maximum acceleration factor of 2 is obtained in the Y direction.

Depending on whether the layer to be measured lies closer to the body or the spine coil array 25,27, an acceleration factor of 2 or 3 is possible in the Z direction. The closer the measurement area lies to the body coil unit 27, the smaller the signal the PAT coil units 25A . . . 25C receive, so that only an acceleration factor of 2 is produced on the basis of the two PAT coil 27A,27B. Because of the low signal intensity of the spine coil array 25, these cannot make any contribution to the PAT. Analogous conditions apply to a measurement area that lies closer to the spine coil array 25 and can consequently be measured at most with an acceleration factor of 3.

If the signals of the three respective underlying coils of the PAT coil units 25A, ... 27B were combined for each coil unit into just two modes or if only two modes were used by the magnetic resonance device employed for PAT imaging, then the acceleration contribution of the various PAT coil units in the X direction and the maximum acceleration factor of the magnetic resonance examination would be reduced to 2.

The table below summarizes the acceleration contributions of a coil unit according to FIG. 2 for the three spatial directions X, Y and Z and depending on the number R of modes used in each case.

|  | X | Y | X |
|---|---|---|---|
| R = 1 | 1 | 1 | 1 |
| R = 2 | 2 | 1 | 1 |
| R = 3 | 3 | 1 | 1 |

Such information can be stored in a memory and arithmetic-logic unit for example for each coil unit usable with a magnetic resonance device and employed for determining the acceleration factor.

A further example to illustrate the method relates below to the use of a sample head coil 31, as shown diagrammatically in FIG. 4. The head coil 31 comprises four PAT coil units, an upper and a lower PAT coil unit forming a pair and two such pairs being arranged in parallel with one another. FIG. 4 shows a section through a pair, i.e. through an upper and a lower PAT coil unit 33,35. The PAT coil units 33,35 include in each case a left, a central and a right coil 33L,33M,33R and 35L,35M,35R. The left coil and the right coil are tilted by an angle of, for example, ±60° relative to the plane of the central coil 33M. A head to be examined is located in the measurement area 37 of the head coil 31.

In the X direction, all three coils of a PAT coil unit have a differing sensitivity profile. In accordance with the system of coordinates described in FIG. 4, an acceleration contribution in the X direction of 3 is possible by means of the lower and upper coil element. Due to the symmetrical arrangement, only one contribution has to be considered and a value of 3 is produced for the maximum acceleration factor.

An acceleration factor of 3 is also possible in the Y direction if at least one upper and one lower PAT coil unit are selected simultaneously. This is because of the geometrically angled arrangement of the coils of the PAT coil units 33,35 and the significantly different sensitivity profiles which result in the Y direction for the various modes and coil signals. Accordingly, an acceleration contribution of approx. 1.5 is assigned to the PAT coil units of the head coil in the Y direction, the contribution taking this additional geometric information into account and where there is a combination of two PAT coil units resulting in an acceleration factor of 3.

Because of the offset arrangement in the X and Y direction of the coils 33L,33M,33R and 35L,35M,35R in the PAT coil units 33 and 35, an acceleration contribution or 1 that is independent of the number of mode signals used is produced in the orthogonal direction. Because of the two pairs of PAT coil units 33,35 lying parallel, the head coil 31 has an acceleration factor of 2 in this direction.

The table below shows possible acceleration contributions which can be assigned to the PAT coil units of the head coil from FIG. 4.

|  | X | Y | Z |
|---|---|---|---|
| R = 1 | 1 | 1 | 1 |
| R = 2 | 2 | 1.2 | 1 |
| R = 3 | 3 | 1.5 | 1 |

In the Y direction, the acceleration contribution of 1.5 has been assigned in the table in respect of the use of three modes of each PAT coil unit. If just two modes are used, then an acceleration contribution of 1.2 is still produced on account of the additional geometrical information in the Y direction, the decisive factor here being that the value is greater than 1.

What is notable are these non-integral figures shown in the table for the acceleration contributions in the Y direction, which take into account the curved arrangement of the coils of the coil units 33,35 in the Y direction. The modes of a coil unit cannot bring about acceleration with sufficiently good image quality in the Y direction alone.

The specification of non-integral acceleration contributions consequently represents an opportunity for examining the interaction of coil units with further coil units. For example, if two identical coil units arranged in mirror symmetry are used, PAT can be implemented with an acceleration factor of 3. This also applies to the use of three modes for each coil unit with differing sensitivity distributions in the Y direction.

The embodiment of the head coil illustrates the simplifying effect of the method which is based on the specification of acceleration contributions for coil units. The complex structure of coil units, the widely differing geometric arrangements of the coil units in relation to one another and/or the option of combining the signals of coil units or coils with one another into a wide variety of modes result in a high degree of complexity of the parameters to be set for a magnetic resonance examination by means of PAT. This complexity can be difficult for an operator to grasp and renders the setting of optimally image-accelerated magnetic resonance examinations difficult. A partially or fully automated calculation of the acceleration factor according to the method which is carried out with the aid of the acceleration contributions according to the invention makes it possible for the influencing parameters to be taken into account.

In order to implement the spatial conditions of the different coil units in a partially or fully automated process for determining the acceleration factor, it is advantageous for each coil unit, in particular for PAT coil units comprising multiple coils, to provide details of the acceleration contributions in a coil-unit-specific reference system. This should be individually adapted to the geometric structural shape and the spatial directions on which it is based. An example of the provision of such details is provided by the tables for the planar PAT coil unit 21 and the head-coil units 31 relating to the plotted orthogonal reference system.

To determine an effective acceleration contribution and to determine the acceleration factor, it is advantageous to know the position the reference system for the acceleration contributions of a coil unit in relation to the measurement area and the reference system which determines in the measurement area the position of the layer(s) to be measured, i.e. the direction(s) of measurement. The former can be carried out as part of the measurement preparation by detecting the coil position, i.e. measuring the position and orientation of a coil unit in the magnetic resonance device, or by manually inputting the appropriate parameters. The latter is defined during planning of the MR examination.

As stated, with knowledge of the spatial position of a coil unit relative to the measurement area, the effective acceleration contributions of these coil units can be determined. This is illustrated by way of example in FIG. 5. In the reference system for the acceleration contributions, the acceleration contributions 41X, 41Y and 41Z are assigned to a coil unit in the X, Y and Z directions. They form the components of a vector 43. A measurement volume is arranged perpendicular to the X-Z plane at an angle α to the Z axis. The interface between X-Z plane and slice, for example, is specified as the direction of data acquisition ρ.

The component whose direction is closest to the direction of data acquisition, for example, can be defined as the effective acceleration contribution 41Z. The criterion "closest" can also be supplemented here by further parameters if, for example, there is a particularly powerful acceleration effect (high acceleration contribution) in the X direction. Alternatively, the effective acceleration contribution can be determined by projecting the vector 43 onto the direction of data acquisition p. This produces, e.g. the acceleration contribution 47. With the aid of the effective acceleration contributions, the method can be flexibly adapted to tilted slices, for example.

On the other hand, with knowledge of the spatial position of the different coil units in relation to the measurement area, the (effective) acceleration contributions of the different coil units can be combined with one another into the acceleration factor. It must be remembered that, to avoid multiple inclusion of an acceleration effect in a direction of data acquisition, the determination of the acceleration factor should be based only on "independent" coil units.

Such independent coil units can be determined on the basis of the spatial arrangement of the different coil units relative to one another or on the basis of the arrangement of the measurement area relative to the individual coil units. For example, with the aid of a weighted sum of the acceleration contributions, such multiple inclusions can be excluded by weightings with the value zero. Also, by means of the weightings, the influence of the distance between coil unit and measurement area can be evaluated continuously, for example. The coil units can be weighted e.g. by forming clusters, whereby one acceleration contribution is assigned to one cluster for one direction in each case. This value can, for example, be the greatest of all the coil units lying in the cluster. Alternatively, evaluations can be carried out for all statistical combinations of coil units, so as to identify the combination of coil units which most precisely determines the acceleration factor in the parallel image acquisition.

The determination of effective acceleration contributions and the determination of the acceleration factor preferably can be combined. In addition, the determination of the acceleration factor can be carried out automatically by requesting a measurements record of a PAT measurement. The acceleration factors determined can be transferred directly to the measurements record, so that, by requesting the measurements record, an operator is spared the time-consuming considerations and inputs regarding acceleration.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining an acceleration factor for a direction of magnetic resonance data acquisition in a parallel image acquisition comprising the steps of:

from multiple coil units, respectively emitting output signals for parallel image acquisition;

assigning an acceleration contribution for at least one magnetic resonance data acquisition direction to each coil unit dependent on a sensitive volume of that coil unit;

designating relevant coil units, among said multiple coil units, which, dependent on an arrangement of the respective sensitive volumes of said relevant coil units in relation to a measurement volume, contribute to acceleration of data acquisition in said parallel image acquisition;

specifying said direction of data acquisition in said measurement volume; and automatically electronically determining an acceleration factor in said direction of data acquisition from the respective acceleration contributions of said relevant coil units, depending on the respective positions of said relevant coil units relative to one another and relative to said measurement volume and to said direction of data acquisition.

2. A method as claimed in claim 1 comprising, for one of said relevant coil units, determining an effective acceleration contribution in said direction of data acquisition dependent on the acceleration contribution of said one of said relevant coil units, and a position of said one of said relevant coil units to said direction of data acquisition, and replacing said acceleration contribution with said effective acceleration contribution when automatically electronically determining said acceleration factor.

3. A method as claimed in claim 1 comprising employing linear combinations of the respective output signals of the relevant coil units for said parallel image acquisition.

4. A method as claimed in claim 1 comprising determining the sensitive volume of at least one of said coil units using a sensitivity profile for said one of said coil units.

5. A method as claimed in claim 1 wherein at least one of said multiple coil units comprises a plurality of individual coils disposed in a predetermined geometric arrangement with respect to each other designed for parallel image acquisition.

6. A method as claimed in claim 5 wherein each of said coils emits a coil output signal, and comprising employing signals for said parallel image acquisition selected from the group consisting of said coil output signals and linear combinations of said coil output signals.

7. A method as claimed in claim 5 wherein each of said individual coils has a sensitivity profile, and comprising determining said sensitive volume of said at least one coil unit from the respective sensitivity profiles of said individual coils.

8. A method as claimed in claim 5 wherein each of said individual coils emits a coil output signal, and comprising determining said sensitive volume of said at least one coil unit from linear combinations of said coil output signals.

9. A method as claimed in claim 1 comprising defining said acceleration contribution for at least one of said coil units dependent solely on where said at least one coil unit is disposed for said parallel image acquisition.

10. A method as claimed in claim 1 comprising employing a further coil unit in addition to said multiple coil units, and comprising defining the respective acceleration contributions for each coil unit dependent on said further coil unit dependent on said further coil unit.

11. A method as claimed in claim 1 comprising, for each of said multiple coil units, assigning three acceleration contributions respectively for three spatial directions, dependent on the geometry of that coil unit.

12. A method as claimed in claim 1 comprising defining at least one of said acceleration contributions as a vector having a magnitude corresponding to a size of the acceleration contribution.

13. A method as claimed in claim 12 comprising defining said vector as a vector sum of multiple acceleration contributions.

14. A method as claimed in claim 1 comprising designating at least one of said multiple coil units as a relevant coil unit dependent on a degree of overlapping of the sensitive volume of said at least one of said multiple coil units with said measurement volume.

15. A method as claimed in claim 1 comprising employing a phase-encoding direction for said magnetic resonance data as said direction data acquisition.

16. A method as claimed in claim 1 comprising obtaining said magnetic resonance data in said parallel image acquisition from a slice sequence in said measurement volume, and employing a direction of said slice sequence as said direction of data acquisition.

17. A method as claimed in claim 1 comprising, for at least one of said relevant coil units, determining an effective acceleration contribution as a projection of the acceleration contribution of said one of said relevant coil units onto said direction of data acquisition, and replacing the acceleration contribution for said one of said relevant coil units with said effective acceleration contribution for said one of said relevant coil units for determining said acceleration factor.

18. A method as claimed in claim 1 comprising for each of said multiple coil units, assigning a plurality of acceleration contributions for respectively different spatial directions, and for at least one of said relevant coil units, defining an effective acceleration contribution for a direction closest to said direction of said data acquisition, and replacing said acceleration contribution for said one of said relevant coil units with the effective acceleration contribution for said one of said relevant coil units in determining said acceleration factor.

19. A method as claimed in claim 1 comprising determining said acceleration factor as a weighted sum of the respective acceleration contributions of said relevant coil units.

20. A method as claimed in claim 19 comprising forming said weighted sum dependent on a distance of two of said relevant coil units from each other.

21. A method as claimed in claim 19 comprising determining said weighted sum dependent on respective distances of said relevant coil units from said measurement volume.

22. A method as claimed in claim 19 comprising assigning a weighting factor of zero, in determining said weighted sum, for any of said relevant coil units that does not produce an additional acceleration.

23. A method as claimed in claim 1 comprising, for each of a plurality of different directions of data acquisition determining an acceleration factor, and thereby obtaining multiple acceleration factors, and determining an overall acceleration factor from said multiple acceleration factors.

24. A method as claimed in claim 23 comprising producing a visual display of said overall acceleration factor.

25. A method as claimed in claim 23 comprising for subsequent magnetic resonance data acquisition from a subject using said parallel image acquisition, automatically setting said overall acceleration factor.

26. A method as claimed in claim 1 comprising producing a visual display of said acceleration factor.

27. A method as claimed in claim 1 comprising for subsequent magnetic resonance data acquisition from a subject using said parallel image acquisition, automatically setting said acceleration factor.

* * * * *